United States Patent
Biloiu et al.

(10) Patent No.: US 8,142,607 B2
(45) Date of Patent: *Mar. 27, 2012

(54) HIGH DENSITY HELICON PLASMA SOURCE FOR WIDE RIBBON ION BEAM GENERATION

(75) Inventors: Costel Biloiu, Rockport, MA (US); Alexander Perel, Danvers, MA (US); Jay Scheuer, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 866 days.

This patent is subject to a terminal disclaimer.

(21) Appl. No.: 12/200,189

(22) Filed: Aug. 28, 2008

(65) Prior Publication Data

US 2010/0055345 A1    Mar. 4, 2010

(51) Int. Cl.
*C23C 16/00* (2006.01)
*H01L 21/306* (2006.01)
(52) U.S. Cl. ......... 156/345.39; 156/345.35; 156/345.38; 118/723 FI; 118/723 MP; 315/111.81
(58) Field of Classification Search ............. 156/345.35, 156/345.38, 345.39, 345.4; 118/723 CB, 118/723 MP, 723 FI; 315/111.81; 204/298.36; 250/492.1, 492.2, 492.21, 492.3
See application file for complete search history.

(56) References Cited

U.S. PATENT DOCUMENTS

| | | | |
|---|---|---|---|
| 5,476,182 A * | 12/1995 | Ishizuka et al. | 216/68 |
| 5,824,602 A | 10/1998 | Molvik et al. | |
| 6,332,947 B1 | 12/2001 | Ichimura et al. | |
| 6,471,822 B1 * | 10/2002 | Yin et al. | 156/345.49 |
| 6,664,547 B2 | 12/2003 | Benveniste | |
| 7,999,479 B2 * | 8/2011 | Biloiu et al. | 315/111.51 |
| 2003/0218430 A1 * | 11/2003 | Leung et al. | 315/111.81 |

* cited by examiner

Primary Examiner — Luz L. Alejandro

(57) ABSTRACT

An ion source, capable of generating high density wide ribbon ion beam, utilizing one or more helicon plasma sources is disclosed. In addition to the helicon plasma source(s), the ion source also includes a diffusion chamber. The diffusion chamber has an extraction aperture oriented along the same axis as the dielectric cylinder of the helicon plasma source. In one embodiment, dual helicon plasma sources, located on opposing ends of the diffusion chamber are used to create a more uniform extracted ion beam. In a further embodiment, a multicusp magnetic field is used to further improve the uniformity of the extracted ion beam.

11 Claims, 16 Drawing Sheets

HIGH DENSITY HELICON PLASMA SOURCE FOR WIDE RIBBON ION BEAM GENERATION

BACKGROUND OF THE INVENTION

Ion implanters are commonly used in the production of integrated circuits (IC) and flat panels displays to create in a semiconductor wafer, usually silicon, regions of different conductivity by p- or n-type doping. In such devices, a plasma source is used to ionize the dopant gas. A beam of positive ions is extracted from the source, accelerated to the desired energy, mass filtered and then directed toward the wafer. As the ions strike the wafer, they penetrate to a certain depth (depending on their kinetic energy and mass) and create regions of different electrical conductivity (depending on the dopant element concentration) into the wafer. The n- or p-doping nature of these regions, along with their geometrical configuration on the wafer, define their functionality, e.g., n-p-n or p-n-p junctions within the transistors. Through interconnection of many such doped regions, the wafers can be transformed into complex integrated circuits.

A block diagram of a representative ion implanter 50 is shown in FIG. 1. Power supply 1 delivers the required energy (DC or RF) to the plasma source 2 to enable ionization of the doping gas. The gas is fed into the plasma chamber through a mass-flow controlled system (not shown) under the pressure in the mTorr range, ensured by a vacuum pumping system. Depending on the desired dopant, different fluoride or hydride doping gases, such $BF_3$, $PF_3$, $AsF_3$, $GeF_4$, $B_2H_6$, $PH_3$, $AsH_3$, $GeH_4$ or others, with or without co-carrier gas, are introduced. The plasma chamber has an aperture 3 through which the ions are extracted by a combination of electrodes 4. A commonly used scheme is a triode combination in which the plasma chamber aperture is at high positive potential, then a second electrode (suppression electrode) at negative potential and finally a third electrode at ground potential. The role of second electrode is to prevent secondary electrons from streaming back to the plasma chamber. However, other extraction electrode combinations such as thetrode, pentode or Eisel lenses, are also possible. These exiting ions are formed into a beam 20, which then passes through a mass analyzer 6. The extracted ion beam is composed of a mixture of ions. For instance, the beam extracted from $BF_3$ gas will be comprised mainly of $BF_3^+$, $BF_2^+$, $BF^+$, $B^+$, and $F^+$ ions. Therefore, it is necessary to use the mass analyzer to remove unwanted components from the ion beam, resulting in an ion beam having the desired energy and composed of a single ionic specie (in the case of $BF_3$, the $B^+$ ion). To reduce the energy to the desired level, ions of the desired species then pass through a deceleration stage 8, which may include one or more electrodes. The output of the deceleration stage is a diverging ion beam. A corrector magnet 10 is used to expand the ion beam and then transform it into a parallel ribbon ion beam. Following the angle corrector 10, the ribbon beam is targeted toward the wafer or workpiece. In some embodiments, a second deceleration stage 12 may be added. The wafer or workpiece is attached to a wafer support 14. The wafer support 14 provides a vertical motion so that the wafer can be brought in the beam path and then passed up and down through the fixed ion ribbon beam. It also can be rotated so that implants can be performed at different incidence angles with respect the wafer surface. With the wafer out of the beam path, the beam current can be measured by a Faraday cup 16. Based on the beam current value and the desired dose, the wafer exposure time or the number of passes through the ribbon ion beam is calculated.

Taking into account that the rate of ion extraction from the plasma source is given by $$dN_{extr}/dt \cong Anv_B$$

where A is the area of the extraction aperture, n the plasma density, and $v_B=(k_BT_e/m_i)^{1/2}$ the Bohm velocity (with $k_B$, $T_e$ and $m_i$ the Boltzmann constant, electron temperature and ion mass, respectively) a limited number of plasma sources have proved to have sufficient plasma density to be useful as ion sources. In some embodiments, such as Barnas sources, an arc discharge creates the plasma. Tungsten filaments are used to generate a flux of electrons needed to sustain the high arc plasma density. In other embodiments, such as indirectly heated cathodes (IHC) which are also a form of arc discharge, to prevent the filament from detrimental exposure to the plasma and therefore to extend the lifetime of the source, the necessary electrons are provided by thermionic emission from an indirectly heated cathode. While these thermal plasma sources are effective in generating the desired ions, they are typically only used to create atomic ions, due to the high temperatures developed within the arc chamber. Because dissociation energies are typically low, the thermal energy in the arc plasma is often high enough to breakdown molecular bonds and to fractionate the feeding gas into smaller molecules or atoms.

It has been found that for shallow implants applications where low ion energy is required, in order to overcome the detrimental space-charge effects and to increase the productivity of the ion implantation process, molecular gases with higher content of the active dopant in the molecule such as $C_2B_{10}H_{12}$, $B_{10}H_{14}$, and $B_{18}H_{22}$ can be used. The resulting molecular ions can be accelerated at higher energies, thus preventing the beam from the space-charge detrimental effects. However, due to their heavier mass, shallow implants can be performed. For such implantation processes that require molecular ions rich in active dopant rather than dopant atomic ions, low temperature plasma sources such as RF inductively coupled discharges are well suited. In these discharges, the plasma is produced by coupling the power from an RF generator through an antenna. The high RF currents flowing through the antenna give rise to an oscillatory magnetic field which, according to the Maxwell's $3^{rd}$ electrodynamics law:

$$\nabla \times \vec{E} = -\partial \vec{B}/\partial t$$

produces intense electric fields in a limited spatial region (skin depth) which is a function of the RF excitation frequency and gas pressure. Electrons accelerated by these electric fields gain enough energy to ionize the gas molecules and create a plasma. The created plasma is not in thermal equilibrium since electrons have a temperature (usually ~2-7 eV) much higher than ion or neutral temperature (usually slightly above the room temperature). While this discharge is useful in the generation of molecular ions, its efficiency is often less than desired since the plasma density is $\leq 10^{11}$ cm$^{-3}$, which is about one to two orders of magnitude less than arc discharge.

Another potential plasma source for ion implantation purposes is helicon discharge, which is able to generate high plasma densities at relatively low gas temperatures. Different than other RF plasma sources, in helicon discharges, electron heating is based on collisional damping of helicon waves. These waves, which are a particular case of whistler waves, are excited by an RF antenna immersed in a DC magnetic field. The low pressure working gas is introduced in a dielectric chamber, usually a quartz or Pyrex cylinder and the antenna is wrapped around it. Electrons gain energy from the wave and, if their energy is above ionization threshold energy, new electron-ion pairs are created through ionization collisions with the neutral gas atoms or molecules. After each ionization event, this wave can quickly bring electrons to the optimum energy for another ionization process. Furthermore, besides governing the helicon wave excitation, magnetic field presence ensures a plasma confinement, thus reducing the loss of charged particles to the walls of the chamber. It was believed that high ionization efficiency of helicon sources might also come from Landau damping (the resonant damping occurring when the phase velocity of the helicon wave is closer to the electron velocity at energies corresponding to the peak in the gas ionization cross-section). However, the experiments showed that Landau damping accounts for only a few percent of the total energy transferred to electrons. Another energy transfer mechanism that can be accounted for high ionization efficiency of helicon discharge consists of excitation of an electron-cyclotron wave near the surface of the chamber wall, the Trivelpiece-Gould mode, followed by a rapid damping. Another possible mechanism consists in non-linear or parametric coupling of helicon waves to ion-acoustic or lower-hybrid waves followed by their rapid damping. Even not yet elucidated, the energy deposition mechanisms in helicon discharge are very efficient, thus giving rise to high ionization efficiency and therefore, plasma density is usually from one to three orders of magnitude higher than in other RF plasma sources, such as capacitively (CCP) or inductively coupled (ICP) discharges, for a given input power. As compared to electron-cyclotron resonance plasma sources (ECR), which are comparable from the plasma density point of view, helicons have the advantage of running at lower magnetic fields, i.e., 200-300 Gauss compared with 875 Gauss which is necessary for a 2.45 GHz ECR source and higher for higher frequencies.

The afore presented characteristics of the helicon plasma source make it an attractive option as a molecular ion source for ion implantation. Although invented almost four decades ago, helicon discharge has been developed for industrial applications only in the last 10-15 years. Mostly, its application in industry dealt with plasma etching and plasma deposition in the semiconductor industry. However, as it is pointed out below, to date, helicons have not been effectively used as part of an industrial ion source, mainly due to their non-uniform plasma density distribution.

When running in helicon mode the plasma column has a very bright central core denoting a very peaked density profile on the axis of the discharge. Therefore, typically a diffusion chamber is used in conjunction with the source so that the plasma generated in the helicon source expands within the chamber and the peaked density profile relaxes. As FIG. 2 shows, although smoother, the density profile still tracks the profile in the source: a relatively high plasma density on the axis of the discharge but a significant decrease in density along the radial direction. Furthermore, an increase in power only serves to accentuate this characteristic, i.e., by increasing the density at the peak, while narrowing its uniform density radial range. This non-uniform plasma density profile along radial direction characteristic limits the application of this source for large area plasma processing.

In the prior art, there have been attempts to overcome this main drawback of the helicon created plasma, i.e., radial plasma density non-uniformity. To date, helicons have been used in plasma etching and plasma deposition and, to a lesser extent, in ion beam generation. Specifically, helicons have not been used in generating of ribbon ion beams typically used in ion implanters. Therefore, an ion source that can effectively utilize the high plasma density produced by the helicon source and create a wide and uniform ribbon ion beam would be beneficial from ion implantation perspective.

SUMMARY OF THE INVENTION

The problems of the prior art are addressed by the present disclosure, which describes an ion source, capable of generating a wide ribbon ion beam, which utilizes one or two helicon plasma sources. In addition to the helicon plasma source(s), the ion source also includes a diffusion chamber. The diffusion chamber, which is a metal cylinder, has an extraction aperture oriented along the central axis of the cylinder. In this way, the peaked radial density profile associated with a helicon plasma source, which can be seen in the graph of FIG. 2, is not relevant.

In one embodiment, dual helicon plasma sources, located on opposing ends of a diffusion chamber are used to create a uniform plasma density along the axial direction and consequently a uniform extracted ribbon ion beam.

In a further embodiment, a multicusp magnetic field surrounding the diffusion chamber is used to further improve the uniformity of the extracted ion beam.

Beam uniformity can also be controlled by means of several independent controls, including gas flow rate, input RF power and frequency, and magnetic field strength for each of the helicon plasma sources.

Because of the high beam currents that can be generated, a single pass on-wafer solar cell devices or solar cell foils doping can be performed with this ion source.

BRIEF DESCRIPTION OF THE DRAWINGS

FIG. 3b shows a transversal cross-section of the helicon plasma source shown in FIG. 3a;

FIG. 4b shows a transversal cross-section of the helicon plasma source shown in FIG. 4a;

FIG. 5d shows an end view of the ion source shown in FIG. 5a;

FIG. 6d shows an end view of the ion source shown in FIG. 6a;

DETAILED DESCRIPTION OF THE INVENTION

Figure 3A:
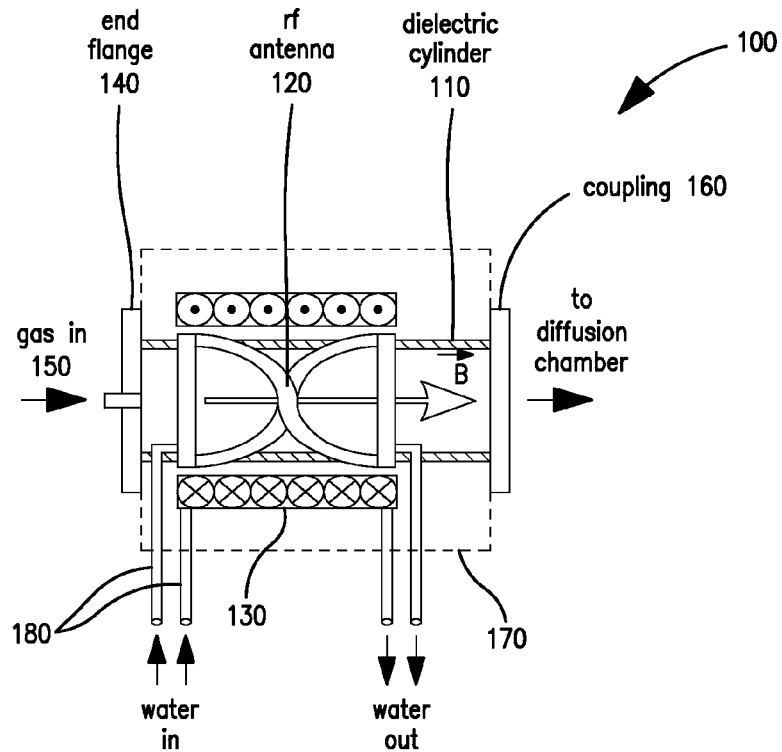
FIG. 3a shows the major components of a conventional helicon plasma source. The antenna shown is a m=+1, Shoji type but Boswell, or Nagoya III type antennae can be used as well.
Figure 3B:
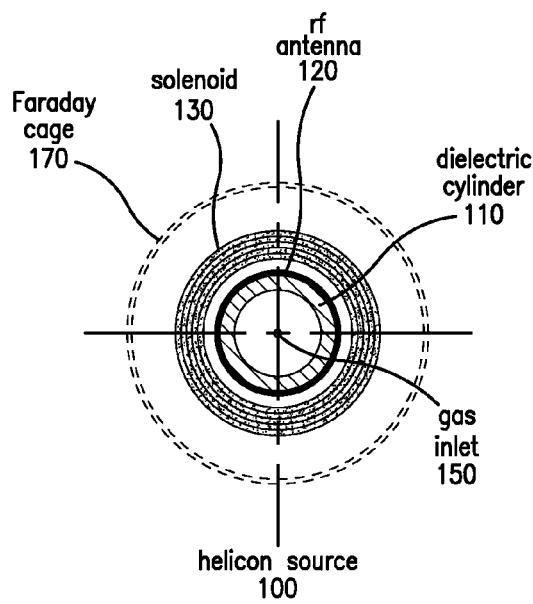

FIG. 3a shows, in a longitudinal cross-section, the components of a typical helicon plasma source 100, while FIG. 3b shows a transversal cross-section through these components. A dielectric cylinder 110 is preferably used to contain the low pressure gas and to allow RF coupling from the antenna 120 to the plasma. For a proper functioning in the high density helicon mode (bright core), the gas pressure within the cylinder is preferably maintained at less than 20 mTorr. The dielectric cylinder 110 can be comprised of any suitable dielectric material, such as quartz, pyrex or alumina. Tightly wrapped around the dielectric cylinder is an antenna 120, used to create the helicon waves. Any type of antenna may be used, including but not limited to Boswell saddle, Nagoya III or half-wave helical. The antenna 120, preferably made of silver plated copper, is powered by an RF power supply (not shown) and the RF matching to the plasma impedance can be accomplished by an L- or PI-type matching network (not shown). Such antenna structures external to a cylindrical plasma column are typically used to set up either m=0 or m=±1 modes with a parallel wavelength (along the magnetic field) defined to some extent by the antenna length and magnetic field strength. In other embodiments, the antenna 120 can be located within the dielectric cylinder 110 or embedded in the wall of the dielectric cylinder.

The helicon wave is a bounded electromagnetic wave in the whistler range of frequencies (between ion and electron-cyclotron frequencies) with both right- and left-handed circular polarizations. To excite the helicon waves, the necessary magnetic field is provided by a magnet 130, most preferably a solenoid or multiple axially symmetric solenoids, capable of providing an axial magnetic field in excess of a few hundred Gauss. This will allow running the helicon source at typical 13.56 MHz commercial RF frequency. However, running at other RF frequencies is also possible. Higher values of the magnetic field strength can be provided by a stack of Sm—Co or Nd—Fe—B permanent magnets. Thus, the magnet 130 is understood to represent either one or more solenoids or a permanent magnet configuration throughout this disclosure. One end of the helicon source is terminated by a flange 140 that preferably contains the gas inlet 150 through which the desired working gas is introduced into the chamber at a certain flow rate. The opposite end is open and preferably has an elastic coupling 160 for connection of the fragile dielectric helicon tube to a metallic diffusion chamber. The solenoid(s) 130 is (are) fed by a DC current supply. The direction of current flow or the orientation of the permanent magnets is chosen so that the magnetic field induction (B) points towards the open end of the dielectric cylinder 110. The ⊗ and ⊙ symbols used in conjunction with the solenoid 130 are used to signify the fact that the current enters and respectively exits the plane of the paper.

In this way, by a proper choice of the antenna excitation mode, the generated helicon waves will propagate along the tube axis away from the end flange 140 and the gas inlet 150. To dissipate the heat developed during operation, both the antenna and the solenoid(s) are preferably water cooled through the cooling lines 180, although other fluids may be used. To reduce the RF radiation emitted into the surroundings by the antenna, a Faraday cage 170 is preferably placed around the helicon source.

Figure 4A:
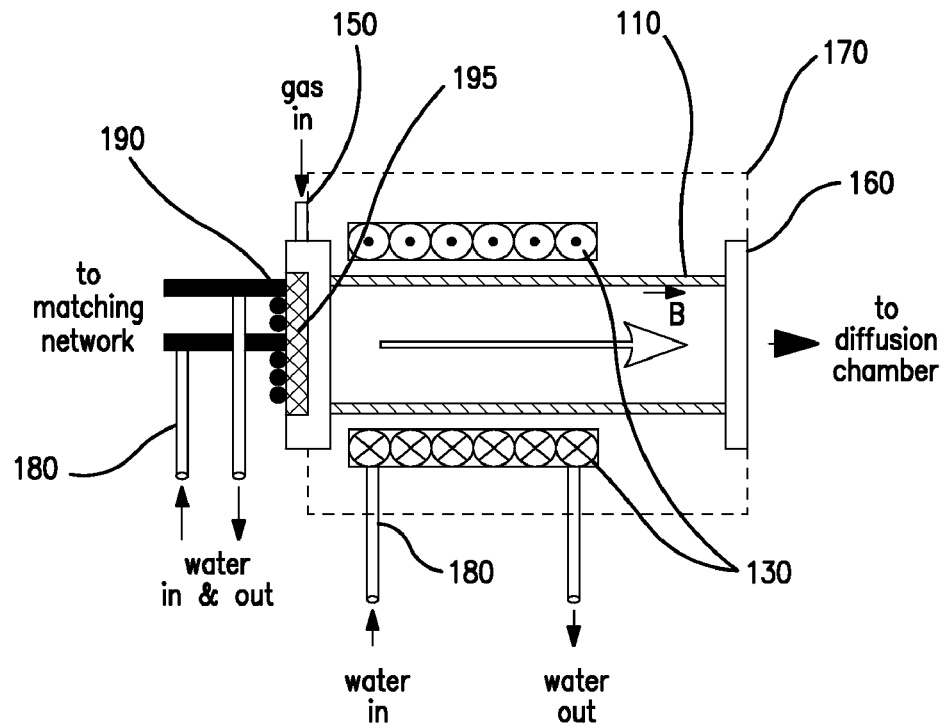
FIG. 4a shows a helicon plasma source using a flat spiral antenna.
Figure 4B:
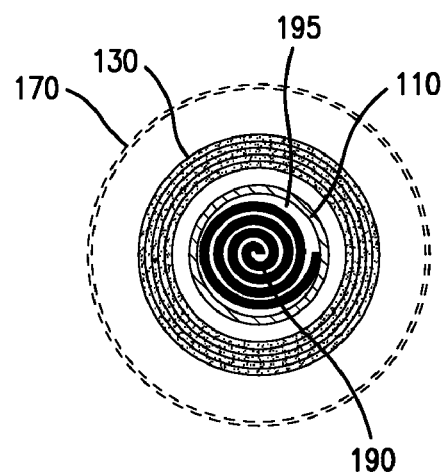

In another embodiment shown in FIGS. 4a and 4b, the antenna 190 has a flat spiral shape. It is located at the closed end of the helicon source. In this case, the transmission of the RF power from the antenna 190 to the plasma is accomplished through a dielectric window 195 (pyrex, quartz, alumina). For this geometry, a second elastic coupler is used to vacuum seal the closed end of the dielectric tube and a different location of the gas inlet 150 is used.

From the theory of helicon discharge, plasma density and parallel wave number are linked by the helicon dispersion equation for a given magnetic field strength:

$$k = \sqrt{k_\perp^2 + k_\parallel^2} \approx \frac{\omega}{k_\parallel} \cdot \frac{\omega_p^2}{\omega_c c^2} = e\mu_0 v_p \left(\frac{n}{B}\right) \quad (1)$$

where k is the wave number,
$\omega_p = (ne^2/\epsilon_0 m_e)^{1/2}$ is the plasma frequency,
n is the plasma density,
$\omega_c = eB/m_e$ is the electron cyclotron frequency in the uniform background axial magnetic field B,
$\mu_0$ is the magnetic permeability in vacuum,
$v_p = \omega/k_\parallel$ is the helicon wave's phase velocity along the tube axis
$m_e$ is the electron mass and the
symbols "∥" and "⊥" stand for parallel and perpendicular directions to the magnetic field induction vector, respectively.

Generally, $k_\perp$ is fixed by the tube radius $J_1(k_\perp a)=0$ (with $J_1$ the Bessel function of first kind and a the tube inner radius). It follows then that for a gas with a peak in the ionization cross-section of a few tens eV (electronVolt), such as about 50 eV, the helicon resonance requires $$v_p = 4.19 \times 10^6 \, ms^{-1}, \, a = 32/f \text{ and } B = 220 \, na \quad (2)$$

with f in MHz, a in cm, n in $10^{13}$ cm$^{-3}$ units and B in Gauss. Thus for a typical industrial frequency of f=13.56 MHz, a tube of ~5 cm diameter will require a magnetic field of ~275 G to provide a plasma density of $5 \times 10^{12}$ cm$^{-3}$.

Figure 1:
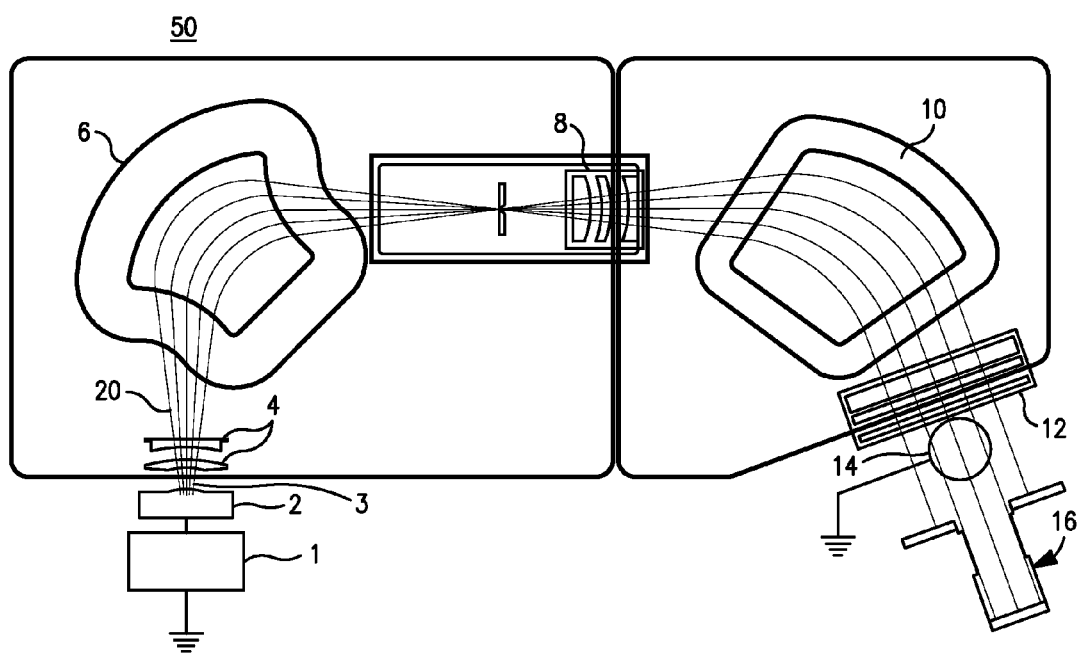
FIG. 1 illustrates a block diagram of a representative high-current ion implanter tool.
Figure 2:
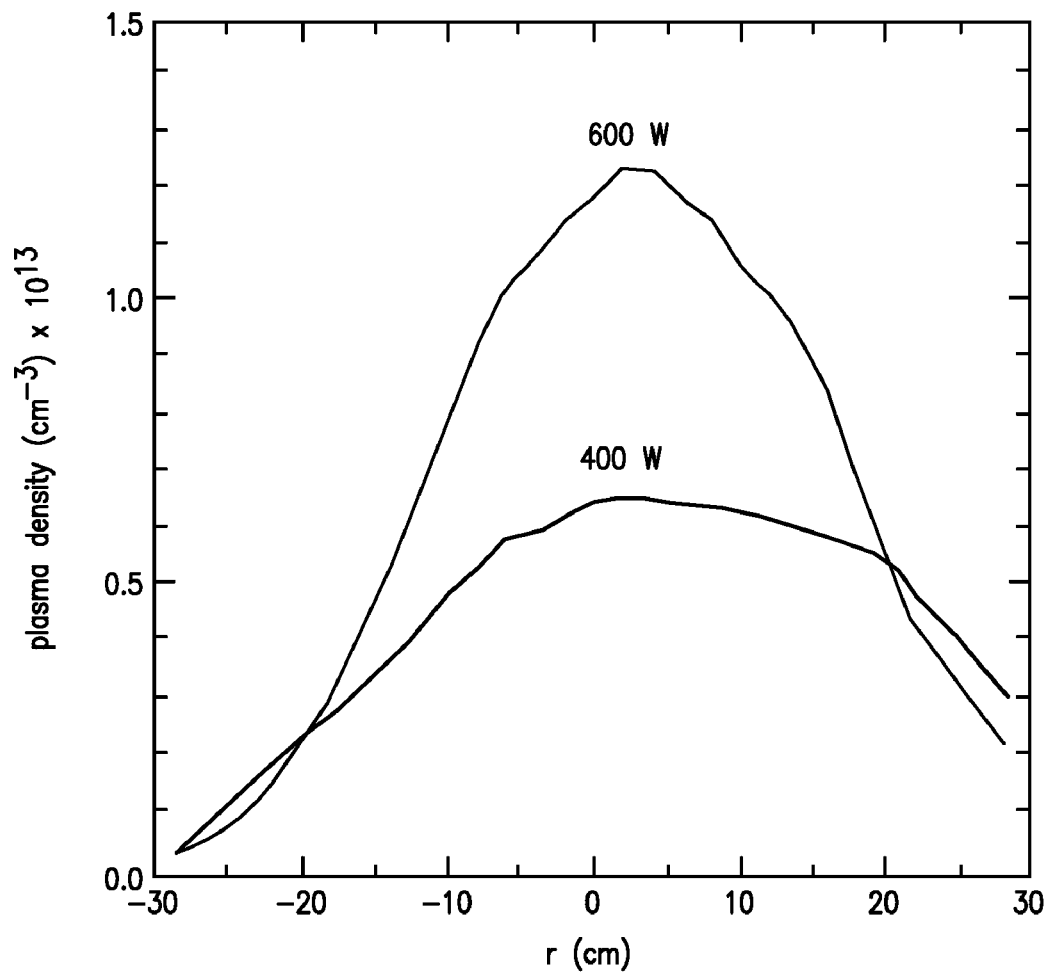
FIG. 2 illustrates the radial plasma density profile in the diffusion chamber of a typical helicon plasma source.

The helicon source described above typically produces a plasma having a radial density profile that peaks along the central axis of dielectric cylinder 110. Even when used in conjunction with a diffusion chamber, although a bit flattened, the density profile in the diffusion chamber still exhibits the same non-uniform radial profile as shown in FIG. 2. Thus, extraction of the ion beam through a slit oriented along an axis orthogonal to the central axis of the dielectric cylinder, results in a peaked ribbon ion beam profile, having a high current density in the central part and lower beam current density at the periphery of the beam. This characteristic is unacceptable for implantation purposes since it will produce a non-uniform implanted dose and consequently a poor final semiconductor device.

Figure 5A:
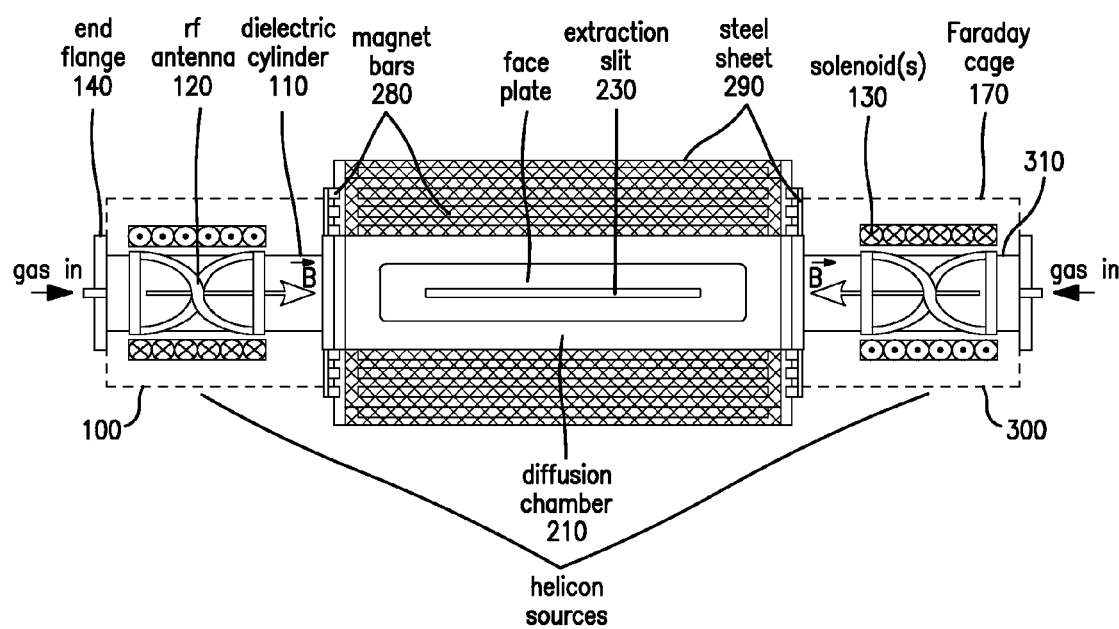
FIG. 5a shows a side view of the first embodiment of the dual helicon ion source.
Figure 5B:
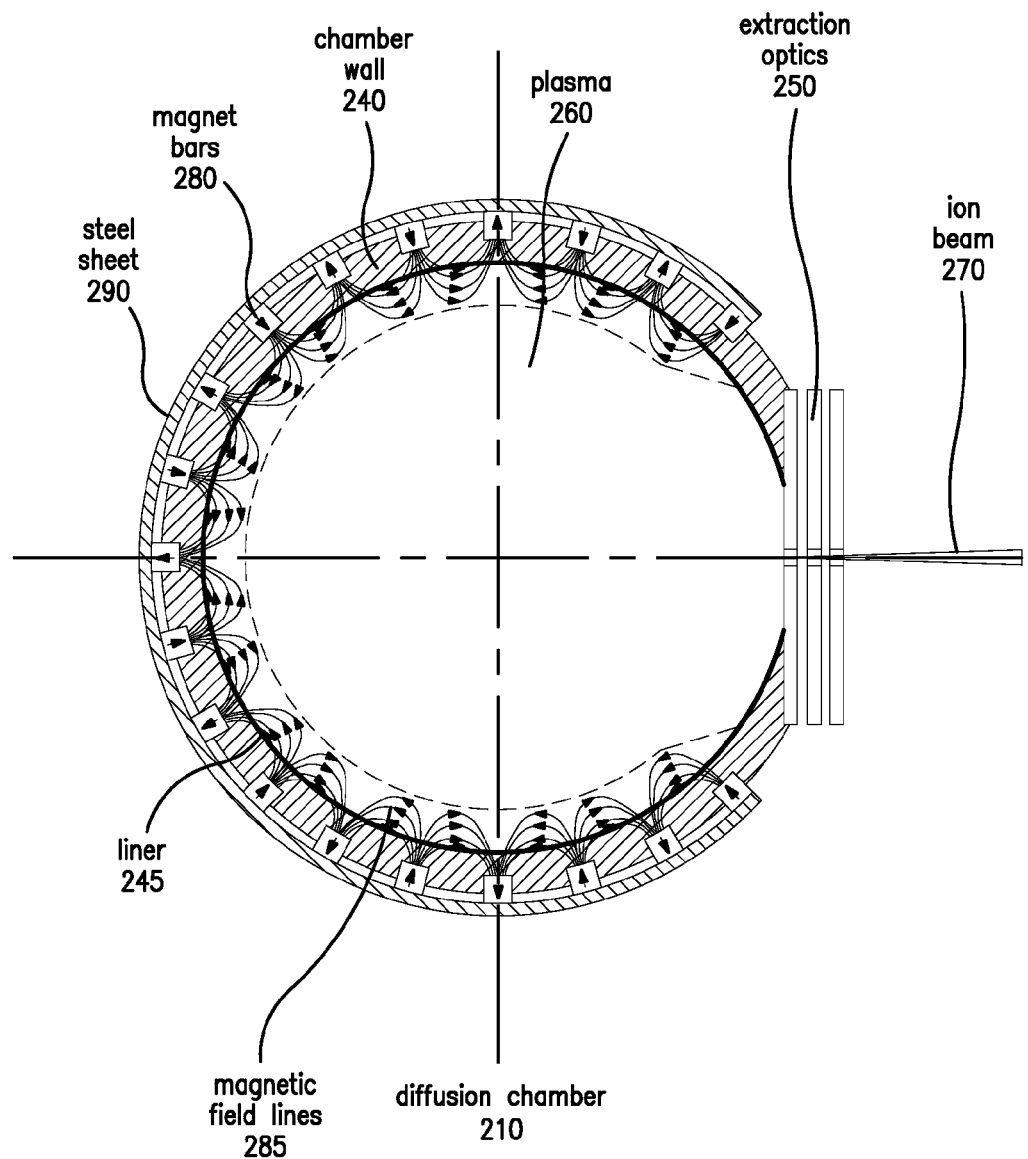
FIG. 5b shows a transversal cross section of the diffusion chamber with one extraction aperture.

FIGS. 5a and 5b illustrate a first embodiment of the ion source 200. Two helicon plasma sources 100, 300 such as those described in conjunction with FIGS. 3 and 4, are axially mated with a diffusion chamber 210. The diffusion chamber 210 is preferably in the shape of a cylinder, preferably having a diameter greater than that of the dielectric cylinders 110, such as 20-50 cm. The helicon sources and the diffusion chamber are aligned such that the central axis of all three components are collinear; in other words the three components are coaxial. The extraction aperture 230 is located on the diffusion chamber, parallel to the central axis of the chamber. The height of the extraction aperture is preferably small, such as 3-5 mm. The length of the diffusion chamber can be chosen to accommodate ribbon ion beam extraction slit having width of 35 cm, which will allow implantation of 300 mm diameter wafers. Because there are not limiting conditions on the length of the diffusion chamber, a wider extraction aperture of 50 cm that would permit implantation of next generation 450 mm diameter wafers is possible.

FIG. 5b shows a cross-section of a representative diffusion chamber. The chamber housing 240 of the diffusion chamber 210 is preferably constructed of aluminum or a similar magnetically permeable material. In certain embodiments, an electrically conductive liner 245 is placed around the inner surface of the chamber housing. This liner 245, which is preferably made of doped silicon carbide or graphite, has two purposes. First, it serves to reduce sputtering and possible contamination of the plasma 260 and resulting ion beam 270 with metals from the chamber wall 240. Second, its electrical conductive nature ensures a control of the plasma potential.

Figure 5C:
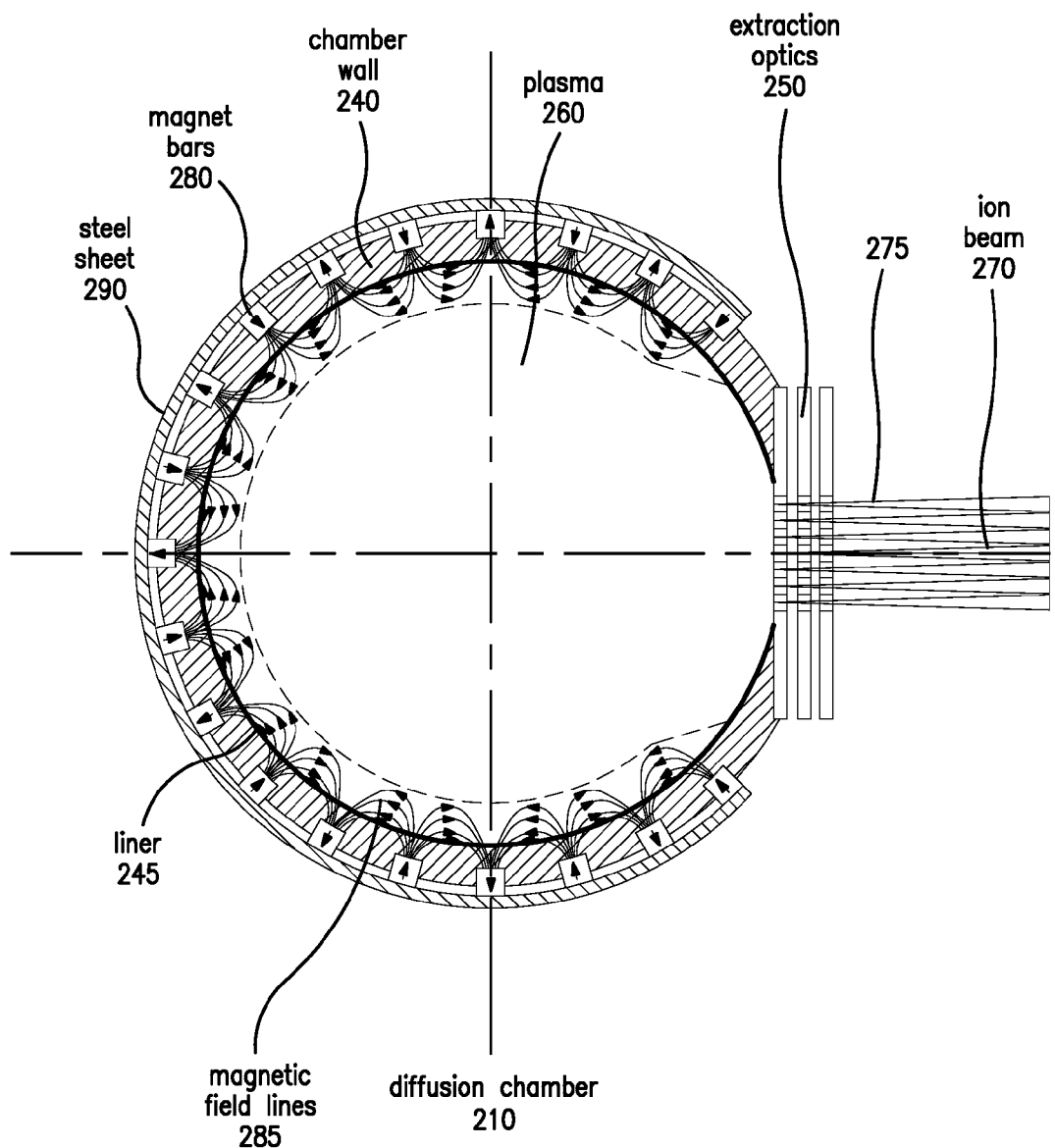
FIG. 5c shows a transversal cross section of the diffusion chamber with multiple extraction apertures.

To allow extraction of positive ions, the chamber is electrically biased at positive potential by a high voltage DC power supply (not shown). In one embodiment, shown in FIG. 5b, a single extraction aperture is used to extract the beam with the help of extraction optics 250. Typically, the extraction optics 250 comprises a set of electrodes of various electrical potentials, which serve to extract the positive ions from the plasma 260. FIG. 5b shows a triode extraction optics, but thetrode or pentode assemblies can be used as well. In one embodiment, this aperture is 3 mm in height and 350 mm in length, although other sizes and configurations are possible. In a second embodiment, shown in FIG. 5c, multiple parallel apertures are used allowing for extraction of multiple beamlets 275 that further are composed and result in a taller and higher current ribbon ion beam 270.

Figure 5D:
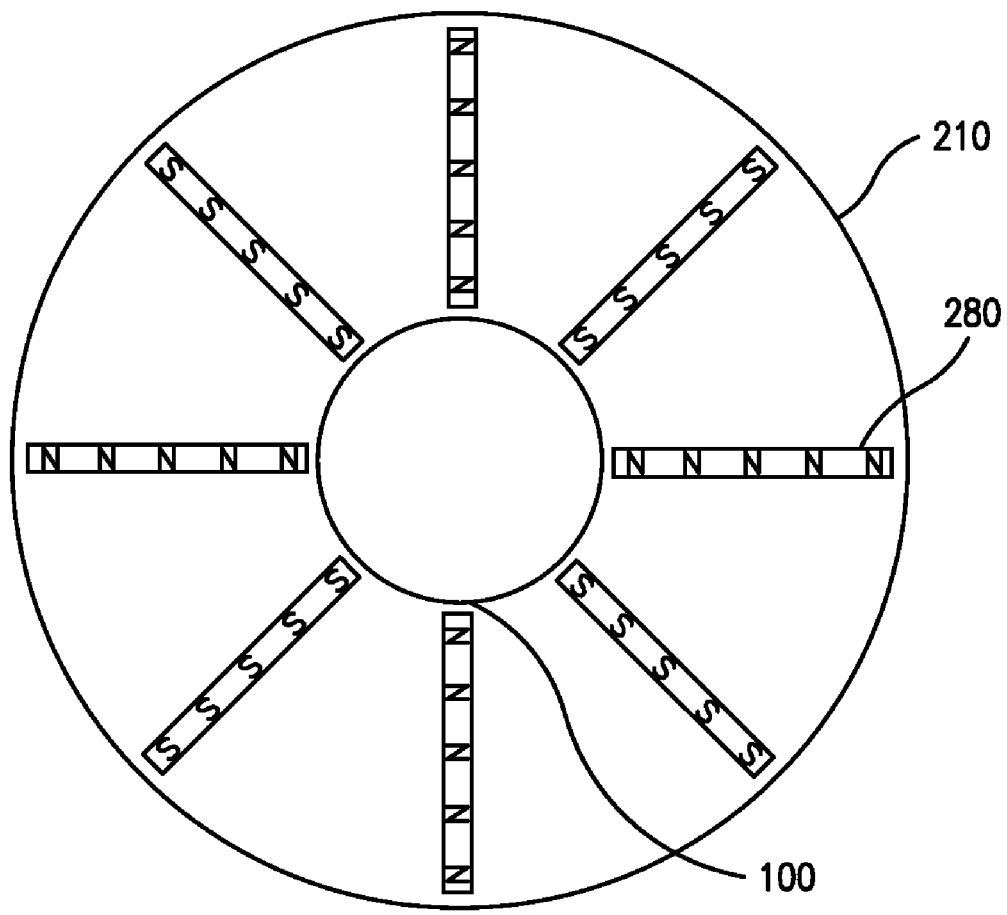

To improve the uniformity of the plasma 260, a multicusp magnetic configuration, preferably realized with rows of permanent magnets bars 280, such as Sm—Co or Nb—Fe—B, oriented along the length of the diffusion chamber, may be used. These magnets 280 are mounted such that the poles that face the outer surface of the chamber housing 240 of the diffusion chamber 210 alternate in polarity. In other words, one magnet row is arranged such that the north pole faces the chamber housing 240, while the magnets in the rows that are adjacent on each side of that row are arranged such that their south poles face the chamber housing. This pattern is repeated about the circumference of the chamber housing, except in the regions in close proximity to the extraction aperture 230. To close as many as possible magnetic field lines 285, on the left and right diffusion chamber walls, the multicusp field can be generated by placing the magnets 280 in continuation and with the same polarity of longitudinal rows that will form the radial pattern shown in FIG. 5d. The magnetic field strength B and the penetration depth y of the magnetic field lines 285 in the plasma are controlled by the circumferential separation d of the magnets having alternate polarity, by the magnetic field strength at the magnet surface $B_0$ and by the magnets width $\Delta$, according to the equation:

$$B(y) = \frac{2B_0\Delta}{d}\exp\left(-\frac{\pi y}{d}\right)$$

By a proper adjustment of these parameters, a strong magnetic field can be created near by the chamber wall whereas the bulk plasma is magnetic field free. In this way, the charged particles (electrons and ions) are trapped by the magnetic field lines 285 and thus resulting in lower losses to the chamber walls 240 and implicitly higher plasma density and uniformity. The strength of the magnetic field may be increased by adding a steel sheet 290 that surrounds the magnets and creates the "yoke" effect. In one embodiment for square cross-section shaped Sm—Co magnets having $\Delta=\frac{3}{8}"$, and $d=\frac{3}{4}"$, a magnetic field strength of 50 G at 1.5" from the chamber wall was obtained. For the proposed geometry, the resulting overall multicusp magnetic field causes the plasma 260 to shift toward the extraction aperture 230. By having no magnetic field in the extraction aperture region, the charged particles are free to move toward the extraction aperture 230 and therefore a high density ion beam can be extracted. Shown in FIGS. 5b and 5c by dashed line is the boundary between the bulk, magnetic field free plasma and the zone where a strong magnetic field exists.

Figure 6A:
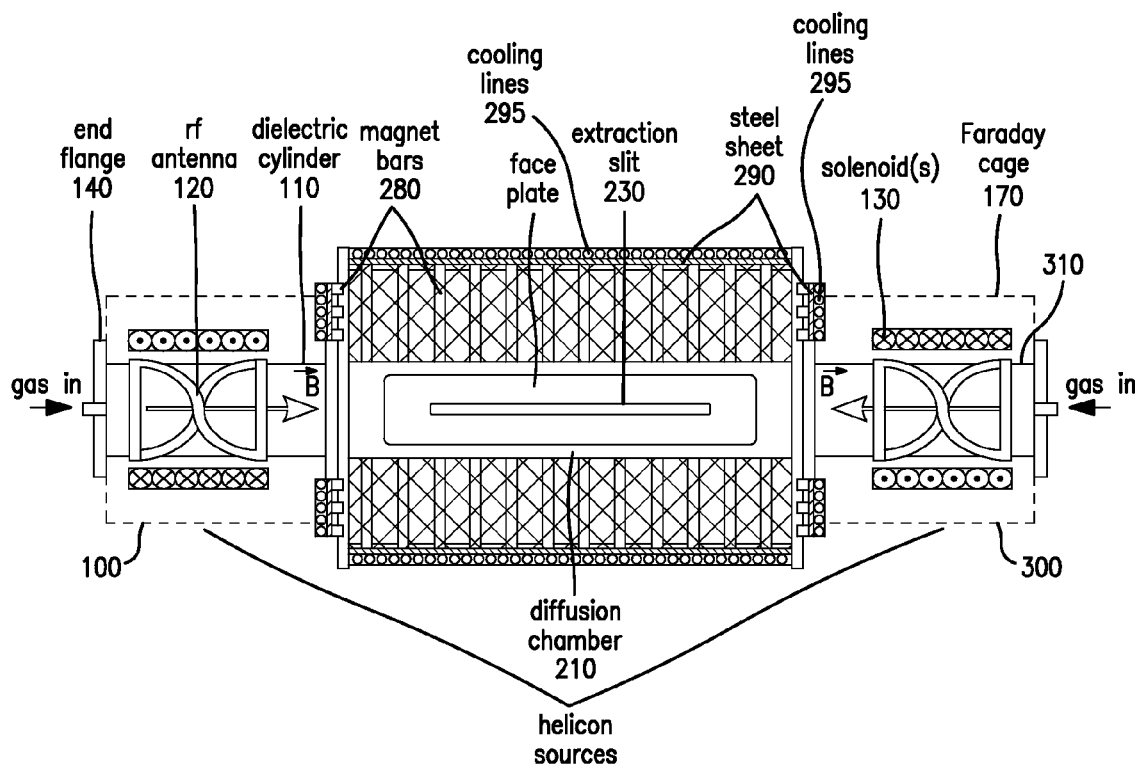
FIG. 6a shows a side view of the second embodiment of the dual helicon ion source.
Figure 6B:
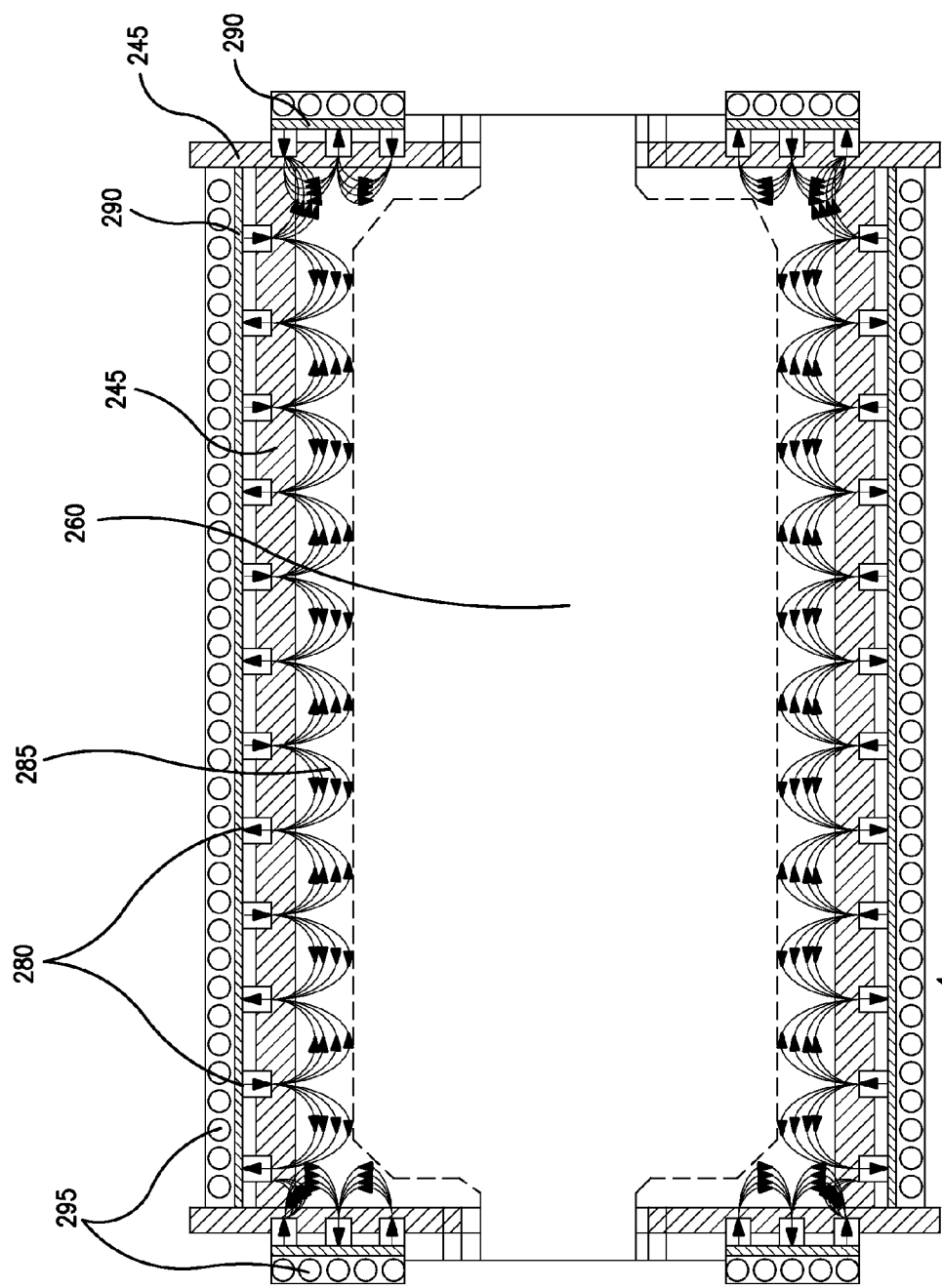
FIG. 6b shows a longitudinal cross section of the diffusion chamber in a plane containing the diameter and parallel with the extraction aperture.
Figure 6C:
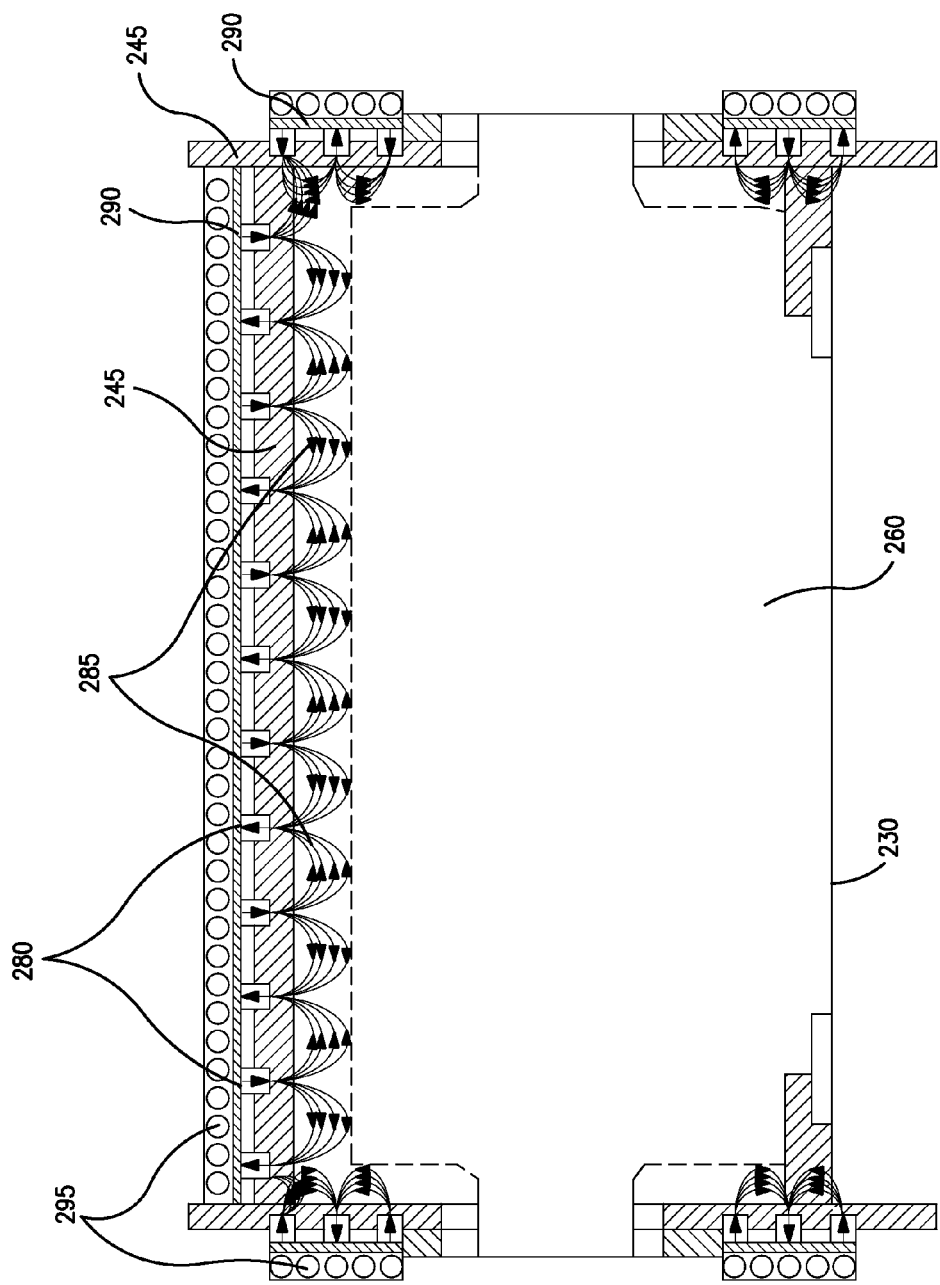
FIG. 6c shows a longitudinal cross section of the diffusion chamber in a plane containing the diameter and the extraction aperture.
Figure 6D:
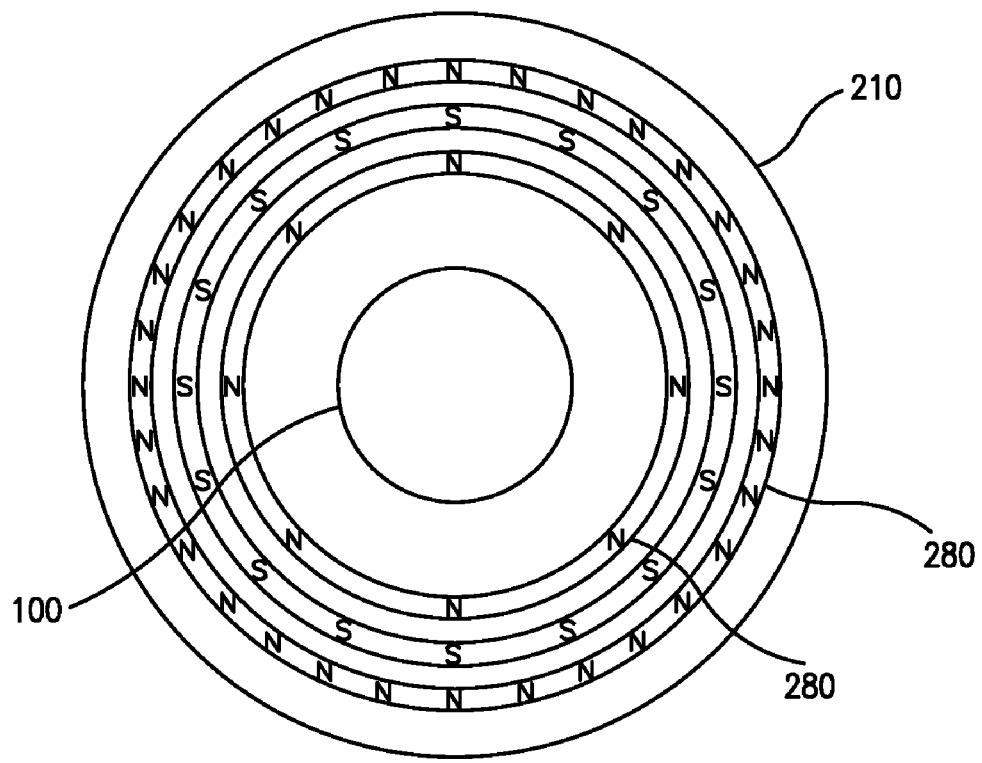

In another embodiment shown in FIGS. 6a-d, the permanent magnet bars 280 generating the multicusp magnetic field 285 are arranged in a circumferential pattern: a row of magnets with the same polarity, e.g., with north pole facing the interior of the chamber is placed along the circumference of the chamber, except the circular sector where the extraction aperture is located. The multicusp magnetic field results from using alternating magnets polarities, i.e., the adjacent circumferential rows separated by longitudinal distance d will have the south pole facing the interior of the chamber and the north pole facing the exterior of the chamber. The pattern is continued on the left and right side walls by placing the magnets with alternate polarities along concentric circles as shown in FIG. 6d. To protect the magnets against the heat developed during operation, a cooling system 295 (shown in FIGS. 6a-c) may be placed around the diffusion chamber. As cooling agent water can be used but other cooling liquids or gases can be used as well.

FIGS. 5 and 6 illustrate two representative configurations used to generate the multicusp magnetic field. For both embodiments, to prevent the beam from undesired magnetic effects, the ion beam extraction region and the bulk plasma is magnetic field free, i.e., the multicusp magnetic field extends over the circumference of the diffusion chamber except the circular sector where the extraction aperture is located. Those skilled in the art will appreciate that other techniques and configurations can be used to achieve this field.

Figure 7:
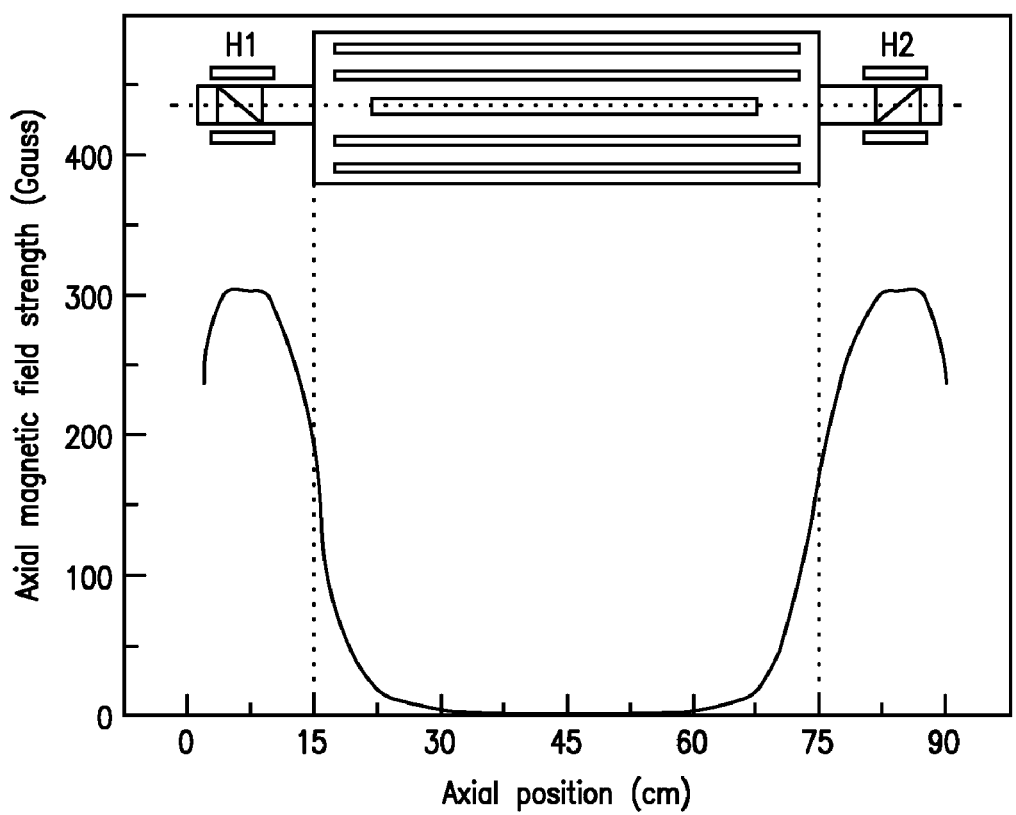
FIG. 7 is a graph showing the distribution of the axial magnetic field induction in the helicon sources and diffusion chamber.

The two helicon sources inject the plasma in a common diffusion chamber. Since the axial magnetic field in each of the helicon sources is in opposite directions, it is essential that the magnetic field generated by each solenoid decrease to zero before entering the diffusion chamber. This can be realized in part by a proper placement of the solenoids against the diffusion chamber and by the left and right diffusion chamber flanges multicusp fields. Since the strength of the local multicusp fields will be relatively high, the weak axial components of the magnetic field generated by the solenoids in the diffusion chamber will be nullified. The resulting axial magnetic field profile shown in FIG. 7 will allow a high enough magnetic field strength in each helicon source for proper operation in helicon mode and, at the same time, a zero axial magnetic field in the diffusion chamber to allow the multicusp field to repel the plasma from the wall but at the same time to "push" it toward the extraction aperture.

Figure 8:
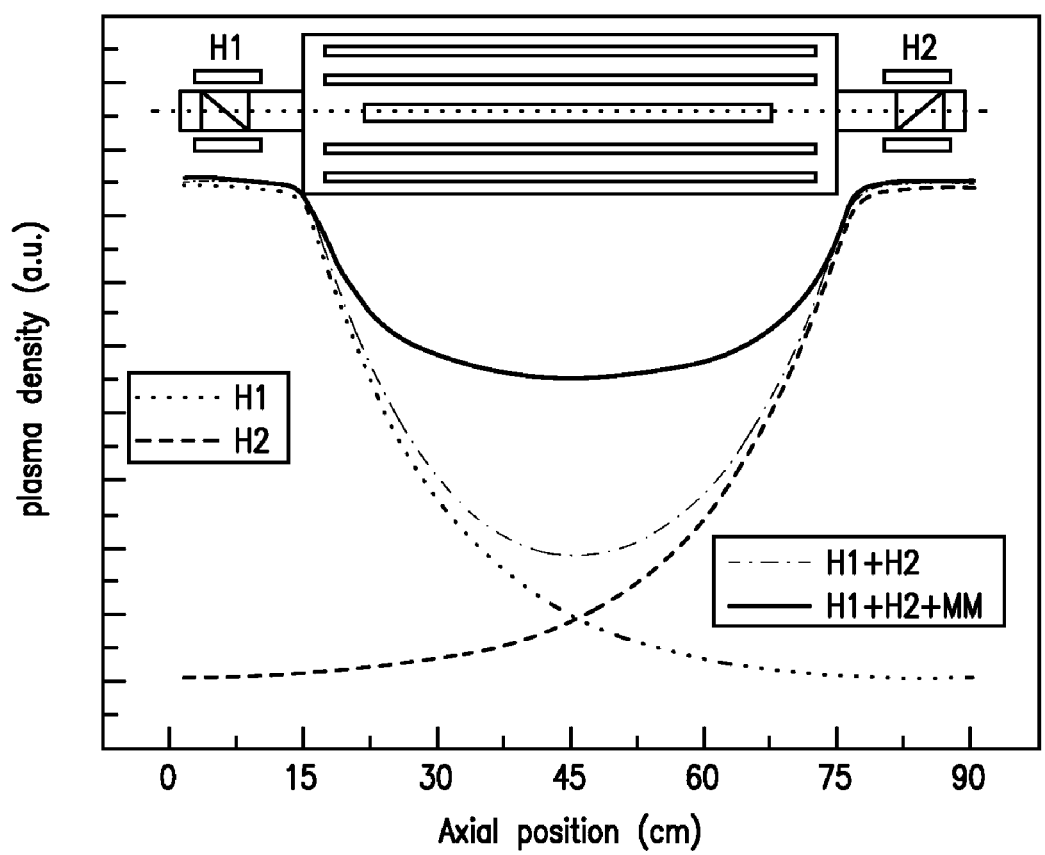
FIG. 8 is a graph showing representative axial plasma densities for various helicon+diffusion chamber configurations.

FIG. 8 illustrates representative graphs showing the plasma density of various configurations. The lines labeled "H1" and "H2" show representative relationships of the plasma density as a function of axial position for the case in which only one helicon source injects plasma into the diffusion chamber. Note that the density decreases as the axial distance from the plasma source 100 increases. The line labeled "H1+H2" shows a representative graph of the plasma density for the configuration in which both helicon sources are in operation, i.e., pumping plasma in the common diffusion chamber, but the diffusion chamber has no magnetic multicusp field. Note that the densities from the individual plasma sources add together to create a more uniform plasma density along the axial direction of the diffusion chamber. In this way, the decrease in plasma density experienced within the diffusion chamber 210 as the distance from the first helicon source 100 increases is counteracted by the existence of a second helicon plasma source 300. The line labeled "H1+H2+MM" shows a representative profile of the plasma density for the configuration in which both helicon sources are working and the magnetic multicusp field is present. The presence of the magnetic multicusp field extends the longitudinal range of the plasma uniformity.

Note that while the preferred embodiment utilizes two helicon sources, the disclosure also contemplates use of a single helicon source coupled with a diffusion chamber. In this embodiment, the non-uniform beam profile resulting from the decrease in plasma density along the longitudinal axis shown by the line labeled "H1" can be counteracted through other techniques, such as the use of an extraction slit having variable height (progressively increasing in the direction of plasma density decrease) and/or introducing a magnetic field gradient in the multicusp magnetic field configuration in the diffusion chamber.

The ion source described above allows the resulting plasma density in the diffusion chamber to be varied in a number of ways. Since each helicon source is independently fed with working gas and the vacuum pumping is accomplished through the extraction aperture on the common diffusion chamber, the rate of gas flow into each of the helicon sources can be varied independently. This will result in a fine adjustment of the plasma density profile along longitudinal direction. A second method of adjusting the plasma density and implicitly the beam uniformity is by varying the magnetic field strength in each helicon source. Since the plasma density and the wavelength of the helicon wave scales with the magnetic field strength, increasing or decreasing the magnetic field strength in each source will allow for a better control of the plasma uniformity and implicitly of the extracted beam profile. A third method that can be used for the uniformity control is varying the amount of power delivered to each antenna. A fourth method that can be used for uniformity control is varying the frequency of the RF power supply. Fine tuning of each of these controls will allow extraction of a high ribbon ion beam current with very good uniformity over extended width. This will allow uniform dose implants for large diameter wafers.

As described above, this device can be used for ion implanters. It is expected that uniform ribbon ion beams of several hundred milliamps, having a width greater than 350 and up to 500 millimeters can be generated using this ion source.

Figure 9:
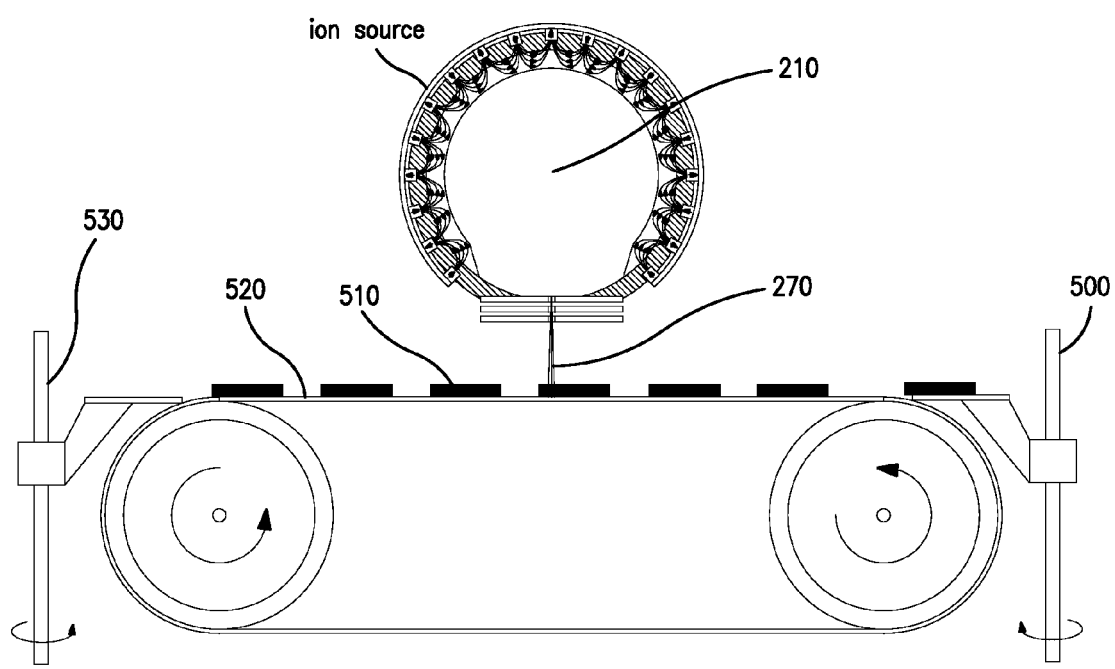
FIG. 9 shows the an ion source configuration used for doping solar cell built on silicon wafers.

However, its uses are not limited to only classical ion implantation applications. This device can be used for other applications, for instance in doping on-wafer build solar cells as shown in FIG. 9. Since the expected extracted current is very high, the desired doping can be realized quickly, preferably in a single pass. In such a case, wafers 510 are placed on surface, such as a conveyer belt 520, which brings the wafers 510 under the incidence of the ribbon ion beam 270. In one embodiment, a robotic arm 500 is used to place the wafers 510 on the conveyer belt 520. In this embodiment, the desired dose is set by the beam current and the speed of the conveyer belt 520. After implantation, the wafers 520 are taken off from the belt 510, such as by a second robotic arm 530.

Figure 10:
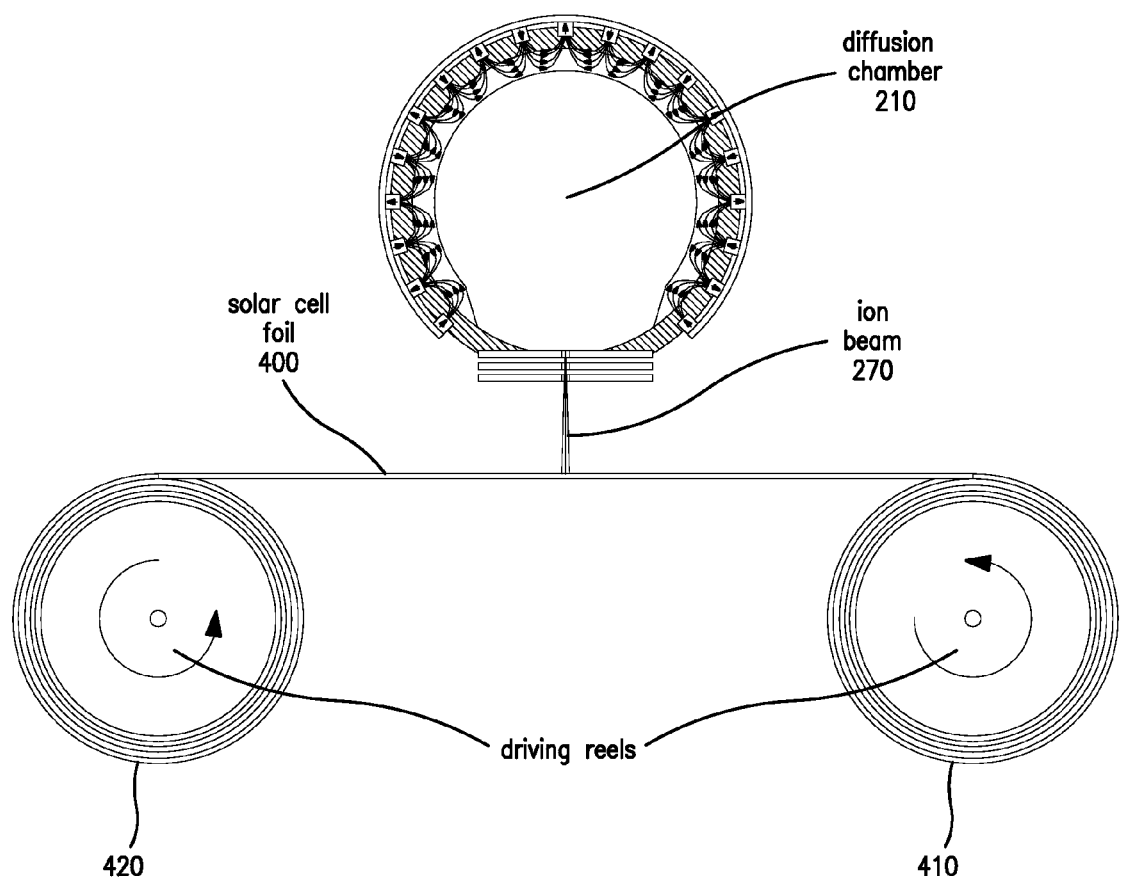
FIG. 10 shows an ion source configuration used for doping solar cell foils.

In a similar fashion, the solar cell foils 400, as shown in FIG. 10, can be doped. Currently, the p-type $CuIn_{1-x}Ga_xS_2$ foil-type solar cells are obtained through a complicated sulfurization process at 475° C. with an intermediate annealing step at 135° C. This process takes more than 90 min and, as a result, yields low productivity. With the previously described ion beam source, the foil 400, which is wrapped onto two motor driven reels 410, 420, can be continuously passed through a vacuum chamber where it crosses the beam path. The high beam current will allow the desired doping to be realized quickly, preferably in a single pass, the dose being set by the beam current and the reel rotational speed. FIG. 10 shows a simple representation of this process. A cross-section of the chamber housing and diffusion chamber is shown, where an ion beam 270 is emitted. Other components of the ion source have been intentionally omitted from the Figure for clarity, but are present in this configuration. This ion beam is ribbon shaped, with the long dimension orthogonal to the plane of FIG. 10. In one embodiment, the solar cell foil is of a width equal to or slightly less than the width of the emitted ribbon ion beam. The ion beam strikes a portion of a solar cell foil 400, as it passes beneath the extraction aperture of the diffusion chamber 210. In one embodiment, the solar cell foil 400 is conveyed via rotating reels 410, 420. The speed of these reels can be adjusted to vary the amount of time each portion of the foil 400 is exposed to the ion beam.

What is claimed is:

1. An ion source comprising:
   a. a first helicon plasma source, comprising:
      i. a first dielectric cylinder having a first central axis, a first closed end and a first open end;
      ii. a first magnet surrounding said first dielectric, cylinder adapted to generate a magnetic field in the direction of said central axis, oriented toward said open end of said first dielectric cylinder; and
      iii. a first antenna capable of generating helicon waves within said first dielectric cylinder;
   b. a second helicon plasma source, comprising:
      i. a second dielectric cylinder having a second central axis, a second closed end and a second open end;
      ii. a second magnet surrounding said second dielectric cylinder adapted to generate a magnetic field in the direction of said second central axis, oriented toward said open end of said second dielectric cylinder; and
      iii. a second antenna capable of generating helicon waves within said second dielectric, cylinder;
   c. a chamber housing, defining a diffusion chamber, comprising first and second ends, wherein said first end of said chamber is in communication with said open end of said first dielectric cylinder, said second end of said chamber is in communication with said open end of said second dielectric cylinder and an extraction aperture having one dimension longer than a second dimension, wherein said longer dimension is parallel to said central axis of said first dielectric cylinder.

2. The ion source of claim 1, wherein said second central axis is parallel to said longer dimension of said extraction aperture and is coaxial with said first central axis of said first dielectric cylinder.

3. The ion source of claim 2, further comprising additional magnets surrounding said chamber housing to create a multicusp magnetic field.

4. The ion source of claim 2, further comprising gas inlets in said first and second closed ends of said helicon plasma sources.

5. The ion source of claim 2, wherein said first and second magnets comprise solenoids, and said ion source further comprises a power supply to control the magnetic fields created by said solenoids.

6. The ion source of claim 2, wherein said first and second magnets comprise solenoids, and said ion source further comprises a first and second power supply, wherein each of said solenoids is controlled by a corresponding power supply.

7. The ion source of claim 2, wherein said first and second magnets comprise permanent magnets.

8. The ion source of claim 2, further comprising an RF power supply in communication with said first and second antenna, adapted to power said antenna.

9. The ion source of claim 2, further comprising a first RF power supply in communication with said first antenna and a second RF power supply in communication with said second antenna, each adapted to power said corresponding antenna.

10. The ion source of claim 8, wherein said RF power is provided to said first and second antenna through two independent matching networks.

11. The ion source of claim 2, further comprising extraction optics located near said extraction aperture, adapted to facilitate the exit of ions from said diffusion chamber.

* * * * *